(12) United States Patent
Pauly

(10) Patent No.: US 10,763,418 B2
(45) Date of Patent: Sep. 1, 2020

(54) THERMOELECTRIC DEVICE

(71) Applicant: IEE INTERNATIONAL ELECTRONICS & ENGINEERING S.A., Echternach (LU)

(72) Inventor: Christian Pauly, Luxembourg (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 16/490,762

(22) PCT Filed: Mar. 1, 2018

(86) PCT No.: PCT/EP2018/054994
§ 371 (c)(1),
(2) Date: Sep. 3, 2019

(87) PCT Pub. No.: WO2018/158352
PCT Pub. Date: Sep. 7, 2018

(65) Prior Publication Data
US 2020/0006618 A1    Jan. 2, 2020

(30) Foreign Application Priority Data

Mar. 3, 2017 (LU) ........................... 100129
Apr. 21, 2017 (LU) ........................... 100175

(51) Int. Cl.
*H01L 35/04* (2006.01)
*H01L 35/32* (2006.01)
*H01L 35/34* (2006.01)

(52) U.S. Cl.
CPC .............. *H01L 35/32* (2013.01); *H01L 35/04* (2013.01); *H01L 35/34* (2013.01)

(58) Field of Classification Search
CPC .......... H01L 35/04; H01L 35/32; H01L 35/34
See application file for complete search history.

(56) References Cited

U.S. PATENT DOCUMENTS

2011/0088737 A1* 4/2011 Nakamura .............. H01L 35/32
                                                          136/200
2011/0314798 A1   12/2011 Limbeck et al.
(Continued)

FOREIGN PATENT DOCUMENTS

CN    102318097 A    1/2012
CN    102939672 A    2/2013
(Continued)

OTHER PUBLICATIONS

International Search Report corresponding to PCT/EP2018/054994, dated Mar. 23, 2018, 4 pages.
(Continued)

*Primary Examiner* — Matthew C Landau
*Assistant Examiner* — Dmitriy Yemelyanov
(74) *Attorney, Agent, or Firm* — Reising Ethington P.C.

(57) ABSTRACT

A thermoelectric device having a channel portion which includes at least one channel layer made of a topological insulator material and having a top surface with at least one groove, wherein each side surface of each groove includes a conducting zone with a pair of topologically protected one-dimensional electron channels. Each channel layer includes at least one n-region and at least one p-region which are alternatingly disposed and extend from a first end to a second end of the channel layer, each n-region comprising at least one n-groove running from a first electrode at the first end to a second electrode at the second end and each p-region includes at least one p-groove running from a second electrode to a first electrode, wherein the first and second electrodes are alternatingly disposed to connect the p-grooves and n-grooves of neighboring regions, whereby all p-grooves and n-grooves are connected in series.

16 Claims, 9 Drawing Sheets

(56) References Cited

U.S. PATENT DOCUMENTS

| | | | |
|---|---|---|---|
| 2012/0138115 A1 | 6/2012 | Chen | |
| 2015/0155464 A1* | 6/2015 | Xu | H01L 35/32 136/200 |
| 2015/0340583 A1 | 11/2015 | Narducci et al. | |
| 2016/0284963 A1* | 9/2016 | Takeda | H01L 35/16 |
| 2016/0300992 A1 | 10/2016 | Rhyee et al. | |

FOREIGN PATENT DOCUMENTS

| | | |
|---|---|---|
| CN | 104681707 A | 6/2015 |
| WO | WO2013119293 A2 | 8/2013 |

OTHER PUBLICATIONS

Written Opinion corresponding to PCT/EP2018/054994, dated Mar. 23, 2018, 5 pages.
C. Pauly et al., "Sub-nm wide election channels protected by topology", retrieved from the Internet: URL:https://arxiv.org/ftp/arxiv/papers/1501/1501.05919.pdf, dated Jan. 23, 2015, 27 pages.
Chinese Office Action with English translation corresponding to Chinese Application No. CN 201880014495.X, dated Feb. 2020, 10 pages.

* cited by examiner

US 10,763,418 B2

THERMOELECTRIC DEVICE

TECHNICAL FIELD

The invention relates to a thermoelectric device and to an integrated circuit comprising such a thermoelectric device.

BACKGROUND OF THE INVENTION

Thermoelectric cooling devices which are based on the Peltier effect allow cooling below ambient temperature and are more compact and less expensive than comparable cooling systems. Moreover, they have no moving parts and do not require any maintenance. One major drawback, however, is that the cooling efficiency of state of the art thermoelectric coolers is rather low and that they dissipate a lot of heat which reduces the overall performance considerably.

The performance and efficiency of a thermoelectric module can directly be related to its thermoelectric figure of merit zT as well as to its temperature gradient $\Delta T$ which is defined by the two temperatures $T_h$ and $T_c$ at the hot and the cold side of the module, respectively. The thermoelectric figure of merit, which describes the ability of a material to convert heat into electricity, is given by $$zT = \frac{S^2 \cdot \sigma \cdot T}{\kappa},$$

where S is the Seebeck coefficient, σ the electrical conductivity, T the absolute temperature, and κ the thermal conductivity. The overall thermal conductivity κ is composed by the sum of the contributions of the electronic and lattice thermal conductivity $\kappa_e$ and $\kappa_l$, respectively. Thus, the performance of a thermoelectric module can be increased by maximizing the so-called power factor $S^2 \cdot \tau$ or by minimizing the thermal conductivity $\kappa = \kappa_e + \kappa_l$. Thus, in order to achieve a high zT, the system should be a good conductor for electrons but a bad conductor for phonons. The latter also implies a large $\Delta T$ throughout the material since a large thermal conductivity would short the thermal circuit.

Prior art thermoelectric modules used for cooling purposes exhibit a rather low efficiency with a figure of merit zT lying around unity. The reason is that the Seebeck coefficient and the electrical conductivity are interrelated in a way that if one tries to increase the electrical conductivity by increasing the charge carrier density, e.g. with heavily doping the material with appropriate elements, the Seebeck coefficient decreases. Hence, improving the figure of merit zT in thermoelectric materials is still a big challenge in material science, hampering the development of novel, more efficient thermoelectric cooling devices.

Macroscopically, the heat transfer in a standard thermoelectric cooler is governed by the current I which is driven from one side of the device to the other. Beside the low figure of merit, the heat transfer in state of the art thermoelectric materials is also rather inefficient due to heat dissipation at elevated operation current I, such that the thermoelectric cooler consumes more power than it effectively transports. Actual cooling modules roughly consume twice as much energy (in the form of electricity) as they transport (in the form of heat). The effective cooling is thereby massively reduced by losses associated with electrical resistance in form of Joule heating and thermal conductivity. The former causes internal heating through $I^2R$ losses. This is a very critical issue because it imposes a lot more heat on the heat sink to cool. Hence, the temperature on the hot side of the cooler, which is connected to the heat sink, is higher so that the effective cooling temperature achieved through the cooling process at the cold side $T_C$ given by $\Delta T = T_h - T_C$ is also higher.

Beside the intrinsic thermal conductivity of the thermoelectric material which is a limiting factor of the maximal $\Delta T$, $\Delta T$ is thus greatly determined by the total amount of power transferred by the thermoelectric module. For instance, if 10 W of heat is transferred across the thermoelectric module from the cold side to the hot side, another 20 W may be added due to Joule heating, so that overall 30 W are transferred to the heat sink. As a consequence, the maximal $\Delta T$ may be reduced e.g. from about 60 K to only 20 K due to $I^2R$ losses. This illustrates that prior art thermoelectric cooling devices add a lot of excess heat to the system, which considerably reduces the performance of the overall cooling process.

US 2015/0155464 A1 discloses a thermoelectric element comprising a plurality of alternatingly disposed n-type and p-type structures which are electrically connected in series by a plurality of electrodes. The electrodes are in contact with one of two thermally conductive plates. Each of the structures is made of a topological insulator material which may be altered by adding chemical dopants in order to tune its Fermi level. The thermoelectric element may be used for Peltier cooling or for power generation.

SUMMARY

It is thus an object of the present invention to provide means for effective thermoelectric cooling. This object is solved by a thermoelectric device according to claim 1 and by an integrated circuit according to claim 15.

In general, the term "thermoelectric device" refers to a device that is based on the thermoelectric effect, i.e. the direct conversion of temperature differences to electric voltage and vice versa. Based on the Seebeck effect, the thermoelectric device may create voltage when exposed to a temperature difference. Based on the Peltier effect, the thermoelectric device may create a temperature difference, when a voltage is applied to it.

The thermoelectric device has a channel portion which comprises at least one channel layer made of a topological insulator material. The term "topological insulator material" refers to a material that has an insulating interior while at least a part of its surface or some of its surfaces are conducting.

Preferably, the topological insulator material may be a weak topological insulator material. The term "weak topological insulator material" herein refers to a material that has an insulating interior and some surfaces which are conducting, while other surfaces are insulating. In particular, it depends on the orientation of a particular surface whether it is conducting or insulating. Examples of weak topological insulator materials that may be used include $Bi_{14}Rh_3I_9$, $KHgSb$, $Bi_2Te_1$, $Bi_1Te_1$ and $Bi_4I_4$. However, other three-dimensional topological materials may be suitable, too. The embodiments described herein make use of topologically protected one-dimensional electron channels in a three-dimensional topological material. So far, the only known and also experimentally verified class of three-dimensional materials which have topologically protected one-dimensional channels is the class of weak topological insulators. But there are theoretical proposal which predict that there might also be other classes of three-dimensional topological materials which have one-dimensional channels. However, this is still not verified experimentally. As will be explained in the following, the composition of the (weak) topological insulator material may be different in different regions of the channel layer or different materials may be used in the different regions.

Each channel layer has a top surface with at least one groove. Normally, a dimension of the channel layer perpendicular to the top surface (i.e. the thickness of the channel layer) is considerably less than any dimension along the top surface (i.e. the length or width of the channel layer). In particular, the thickness of the channel layer may be less than 20 nm, less than 10 nm or even less than 5 nm. As is understood, each groove (which may also be referred to as a trench) is an elongate depression or recess within the top surface. The cross-section of a groove may be rectangular, having side surfaces extending perpendicular to the top surface and a bottom surface extending in parallel to the top surface. The depth of a groove (i.e. its dimension perpendicular to the top surface) may be less than 5 nm, less than 2 nm or even less than 1 nm. The depth may correspond to the thickness of one atomic layer or only a few atomic layers. The term "top surface" is not to be construed in a limiting way and simply serves to denote this surface within a reference frame where it is the uppermost surface of the channel layer. It is understood that in operational state, the top surface may be facing sidewards or even downwards. Preferably, the top surface is planar, apart from the above-mentioned groove(s). During a manufacturing process, each channel layer may be formed by deposition processes like electron beam epitaxy while the groove(s) may be formed by nano-structuring methods including but not restricted to photolithography, e-beam-lithography or scanning probe microscopy scratching.

The side surfaces of the grooves, which may be perpendicular to the top surface, are at least partially conducting. More specifically, each side surface comprises a conducting zone with a pair of topologically protected one-dimensional electron channels. In this context, "side surface" of course refers to those surfaces of the groove that extend from the top surface "downwards", i.e. away from the top surface. Even though the inside of the topological insulator is insulating, the side surfaces are at least partially conducting, i.e. the one-dimensional electron channel only covers a part of the side surface, and allow for a movement of electrons along the length of the groove. In particular, electrons (or electron holes) may move in either direction, but the current in either direction will be spin-polarized. In other words, electrons flowing in one direction will have a spin that is anti-parallel to the spin of electrons flowing in the opposite direction. Thus, each conducting zone comprises a pair of one-dimensional electron channels. While the term "electron channel" refers to electron as charge carriers responsible for the electrical current, it should be noted that in some cases the current may be attributed to holes rather than to electrons.

Preferably, in particular if the topological insulator material is a weak topological insulator material, the top surface and a bottom surface of each groove are insulating. The (weak) topological insulator material is manufactured so that the top surface and any surface parallel to it are electrically insulating. Other surfaces, in particular surfaces perpendicular to the top surface, may be conducting. The bottom surface of each groove runs along the same direction as the top surface. In particular, the bottom surface may be parallel to the top surface. Thus, the top surface and each bottom surface are insulating.

Each channel layer comprises at least one n-region configured for electron-like conduction and at least one p-region configured for hole-like conduction, which n-regions and p-regions are alternatingly disposed and extend from a first end to a second end of the channel layer. The channel layer comprises two types of regions, namely p-regions and n-regions. These regions are disposed alternatingly. In other words, they are disposed as a sequence wherein each n-region is followed by a p-region and vice versa (unless it is the last region in the sequence). Each region extends from a first end to a second end of the channel layer. If the first end and the second end are spaced along a first axis (e.g. the X-axis), the different regions may be offset along a second axis (e.g. the Y-axis) perpendicular to the first axis. As a minimum, the channel layer comprises one p-region and one n-region, but usually it comprises a plurality of p-regions and a plurality of n-regions. While here and in the following, reference is made to "p-regions" or "n-regions", this always includes the possibility that there is only one p-region and/or only one n-region. However, since the regions are disposed alternatingly, the total number of p-regions and the total number of n-regions can only differ by one or be equal. Preferably, but not necessarily, the first and second ends are disposed on opposite sides of the channel layer. This first and second ends are to be understood as "end portions" rather than "edges" of the channel layer. In some embodiments, each of the first and second ends may correspond to 20% or even 30% of the total length of the channel layer. It should however be noted that the dimensions of the embodiments shown in the figures are not to scale, hence the first and second ends may correspond to 20% or even 30% but maybe also correspond to only 2% or 3%.

Each n-region is configured for electron-like conduction. In other words, at least during operation of the thermoelectric device, the Fermi level in the n-region is adjusted so that the valence band is fully occupied, while electrons moving through the conduction band can be regarded as the charge carriers responsible for any electrical current. Each p-region is configured for hole-like conduction. In other words, at least during operation of the thermoelectric device, the Fermi level in the p-region is adjusted so that the valence band is not fully occupied, wherefore (electron) holes can be regarded as the charge carriers responsible for any electrical current. Since the interior as well as the top and bottom surfaces of the topological insulator material are insulating, the hole-like conduction and the electron-like conduction, respectively, may only occur at the side surface of the grooves of the channel layer.

Each n-region comprises at least one n-groove running from a first electrode at the first end to a second electrode at the second end and each p-region comprises at least one p-groove running from a second electrode to a first electrode, wherein the first and second electrodes are alternatingly disposed to connect the p-grooves and n-grooves of neighboring regions, whereby all p-grooves and n-grooves are connected in series. Since each n-groove runs from a first electrode to a second electrode, these electrodes are electrically connected via the n-groove. The same applies to each p-groove running from a second electrode to a first electrode. Every first electrode is disposed at the first end and every second electrode is disposed at the second end. Normally, there is a plurality of first electrodes and a plurality of second electrodes. As will be explained later, one n-groove and one p-groove may be portions of a single groove rather than distinct, separate grooves, wherefore there are embodiments of the invention where the channel layer comprises only one groove.

The first electrodes as well as the second electrodes are normally made of metal. Suitable metals for each of the electrodes are e.g. gold, copper, aluminum and silver. In the manufacturing process of the thermoelectric device, each electrode may be formed by known additive techniques directly on the channel layer. Although the electrodes are "ordinary" metal conductors, the cross section of the respective electrode can be relatively large compared to the cross-section of the individual grooves, while it may be considerably shorter than each of the grooves. Therefore, any detrimental effect on the total conductivity can be limited or even negligible.

The first and second electrodes are alternatingly disposed to connect the p- and n-grooves of neighboring regions. For example, the first region may be an n-region having an n-groove which is connected at the second and by a second electrode to the p-groove of a neighboring p-region. The p-groove runs from the second electrode to a first electrode at the first end, where it is connected by a first electrode to the n-groove of a following n-region and so on. Altogether, the grooves together with the electrodes form a meandering structure wherein all n-grooves and p-grooves are connected in series by the first and second electrodes.

During operation, a current flows through the p-grooves, the first electrodes, the n-grooves and the second electrodes. As charge carriers move from a p-groove in a p-region to an n-groove in an n-region (or vice versa) via an electrode, they gain or lose energy which corresponds to a certain amount of heat removed from the electrode or disposed in it.

The overall design of the inventive thermoelectric device resembles a conventional thermoelectric device, but instead of the conventional p-type and n-type semiconductors, the first and second electrodes are connected by one-dimensional electron channels in the conducting zones of the p-grooves and n-grooves, respectively. This greatly enhances the effectiveness of the thermoelectric device, because each of these electron channels has a quantized conductance of $e^2/h$ (h being the Planck constant) and electrons within these channels are protected against backscattering. In other words, the conductance does not substantially depend on the length, the depth or the width of the groove. Therefore, the cross-section of each groove can be minimized without affecting the conductance, as long as two neighboring electron channels are not overlapping. The spatial extension of the one-dimensional electron channels depends on their spatial density of states and is for the material $Bi_{14}Rh_3I_9$ in the range of one nanometer only. Size effects that are relevant for conventional metal conductors have much less influence on the electron channels. Thus, the minimal size of the grooves is mostly limited by the manufacturing process. Heat dissipation, which largely limits the effectiveness of conventional thermoelectric devices, can be greatly reduced.

In particular, the thermoelectric device may be used as a thermoelectric cooling element which is based on the Peltier effect and which may enable an efficient active cooling of objects from the sub-micrometer scale to the mm-scale. The field of application may include the telecommunication area, areas in semiconductor industries, in aerospace and military industry as well as in the consumer market. Especially in fields where the cooling of microscopic components (e.g. in electronic devices) becomes more and more important in order to guarantee the performance of the device, the technology disclosed herein may lead to an enhanced improvement of thermoelectric cooling. Due to the scalability of the inventive thermoelectric device and especially due to the small localization length of the contributing one-dimensional electron channels (nm-length scale), very small thermoelectric cooling modules are conceivable. Such cooling modules may be integrated directly in e.g. microprocessors or different electronic circuits.

In general, weak topological insulator materials are formed from heavy elements which is favorable for a low thermal conductivity κ, which, beside a high power factor $S^2 \cdot \sigma$, is one of the main requirements for enhanced thermoelectric performance zT. Most of the weak topological insulator materials known today have in common that every second layer in their structure is a weakly bonded insulating spacer layer which inherently supports large phonon scattering such that the thermal conductivity is limited. The thermal conductivity can be reduced further by reducing the thickness of each channel layer, e.g. to less than 20 nm, less than 10 nm or even less than 5 nm as mentioned above. In contrast to thermoelectric (cooling) devices known in the art where in general thermal conductivity and electrical conductivity are interrelated, the inventive thermoelectric device thus enables a decrease of the thermal conductivity while increasing the electrical conductivity.

Preferably, all first electrodes are thermally connected to a first heat conductor element and all second electrodes are thermally connected to a second heat conductor element. Each of the heat conductor elements is made of an electrically insulating material which, however, should be a good heat conductor. A suitable material is for example ceramic. During operation, one heat conductor element corresponds to a "cold side" while the other heat conductor element corresponds to a "hot side". For example, if the thermoelectric device is used as a Peltier element, one heat conductor element may be in contact with an element to be cooled, e.g. a microprocessor, while the other heat conductor element faces away from that element and may be in contact with a heat sink or the like.

Preferably, at least some regions comprise a plurality of spaced-apart grooves. For an n-region, this means that a plurality of spaced-apart n-grooves run from a first electrode to a second electrode. For a p-region, this means that a plurality of spaced-apart p-grooves run from a second electrode to a first electrode. In particular, every n-region and every p-region may comprise a plurality of spaced-apart n-grooves or p-grooves, respectively. While the conductance of a single groove is rather small, the total conductance can be considerably higher for a plurality of grooves. The same is true for the total resistance of the conducting regions which can be considerably smaller for a plurality of grooves. As the width and depth of the grooves can be in the order of a few nanometers, it is possible to dispose a relatively large number of grooves within a small n-region or p-region, respectively. The number of grooves in one region may be at least 3, at least 5 or at least 10. The spacing between the grooves helps to avoid any interference between the one-dimensional electron channels. In other words, these grooves do not branch, intersect each other or contact each other. Moreover, there is normally a minimal spacing necessary in order to avoid overlapping or hybridizing of electron channels in neighboring grooves. However, the spacing between two grooves may be rather small and may be similar to the width of the individual groove. Preferably, the spacing as well as the width may be less than 10 nm, less than 5 nm, but at minimum 3 nm as the spatial extension of the 1D electron channels in weak topological insulators is of the order of 1 nm. It should be noted that in some embodiments, the spacing may be smaller than the width of the individual groove.

In order to optimally use the available space on the upper surface of the channel layer and to maximize the overall current density, as well as to minimize the overall resistance, it is preferred that at least some of the grooves of one region run parallel. In particular, all (p- or n-) grooves of one (p- or n-) region may run parallel. For instance, the grooves may correspond to a plurality of parallel straight lines along the upper surface. More generally, even if the grooves are not straight, "running parallel" means that all of the grooves of one region are connected in parallel by the same electrode and that the spacing between two neighboring grooves is constant over the length of these grooves.

While it is possible that the n-grooves and p-grooves are separate from each other, they may also be connected or merge into each other. According to such an embodiment, the thermoelectric device comprises at least one meandering groove comprising at least one p-groove connected to a n-groove by a turning groove, each turning groove extending from an n-region to a p-region. As far as the physical shape is considered, there may be no clear distinction between the p-groove, the turning groove and the n-groove. Topologically, these grooves are parts or sections of the meandering groove. The turning groove may be curved with a smooth transition to the p-groove and the n-groove, respectively. Alternatively, it may be angled with respect to the adjacent p-groove and n-groove. Either way, the turning groove corresponds to a reversal point of the meandering groove. It should be noted that although the turning groove extends from an n-region to a p-region, there is normally no or only negligible current flow through the turning groove due to the presence of the potential barrier induced by the p-n junction. Therefore, at least most of the current between the p-groove and the n-groove flows through a first or second electrode. It is understood that each channel layer may comprise a plurality of spaced-apart meandering grooves. In particular, these meandering grooves may run parallel.

As already mentioned, the first and second electrodes are necessary to establish a sufficient current flow between the p-grooves and n-grooves, even if these are connected by a turning groove. According to one embodiment, at least one of the first and second electrodes is disposed on a turning groove. This of course implies that the respective electrode is electrically connected to the turning groove. The respective turning groove may be at least partially filled with the (metal) material of the respective electrode. If the channel layer comprises several meandering grooves, a single (first or second) electrode may be disposed on the turning grooves of all meandering grooves.

According to one embodiment, each channel layer is disposed on an insulating layer which comprises an insulating material different from the topological insulator material, wherein a positive electrode is disposed in the insulating layer under each p-region and a negative electrode is disposed in the insulating layer under each n-region. The channel layer is disposed on the insulating layer, i.e. it is disposed above the insulating layer. In other words, the insulating layer is positioned on a side opposite the top surface. The term "insulating" herein refers to an electrical insulator, which normally has a conductivity of less than $10^{-8}$ S·cm$^{-1}$. Positive and negative electrodes are disposed within the insulating layer, i.e. each electrode is at least partially surrounded by the insulating material. The function of the insulating material is to electrically insulate the positive and negative electrodes from each other and from the channel layer above. Suitable metals for each of the electrodes are e.g. gold, copper, aluminum and silver.

In the manufacturing process of the interconnection, the insulating layer and the electrodes may be formed by known additive techniques. A surface area or cross-section of each positive or negative electrode may correspond to at least 50% or at least 70% of the area of the (n- or p-) region above it. Physically, the positive and negative electrodes may be identical, but each positive electrode is connectable to a positive voltage while each negative electrode is simultaneously connectable to a negative voltage. In order to facilitate the connection, a conductive path in contact with the respective electrode may be disposed within the insulating layer, which conduct a path runs to an outer surface of the insulating layer. The path may be formed of the same material as the electrode and by the same manufacturing process. During operation, the positive voltage of the positive electrode influences the Fermi level of the topological insulator material of the p-region above it. Likewise, the negative voltage of the negative electrode influences the Fermi level of the topological insulator material of the n-region above it. It is understood that each positive and negative electrode needs to be connected to a voltage source in order to provide the respective voltage.

It is preferred that the insulating material has a rather low relative permittivity such that a capacitive coupling between adjacent electron channels is minimized. More particularly, the relative permittivity may be less than 10, preferably less than 5. One example of such a material is silicon dioxide, which has a relative permittivity of about 3.9.

Normally, the Fermi level in all p-regions is to be adjusted to the same value. The same applies to the Fermi level in all n-regions. In this case, it is normally preferred to apply the same positive voltage to all positive electrodes and the same negative voltage to all negative electrodes. To facilitate this, all positive electrodes can be electrically connected and/or all negative electrodes can be electrically connected. For instance, a system of conductor paths may be formed that connects all positive electrodes and all negative electrodes, respectively. These paths may at least partially be disposed within the insulating layer but may also at least partially extend outside the insulating layer.

Apart from using positive and negative electrodes disposed under the respective regions as described above, the different regions may alternatively be provided by appropriate doping. In other words, the topological insulator material in the p-regions may be doped differently from the topological insulator material in the n-regions.

While the thermoelectric device may be realized with a single channel layer, it is highly preferred that the channel portion comprises a plurality of channel layers arranged in a stacked manner. This means that the plurality of channel layers are arranged above each other along a direction perpendicular to the upper surfaces of the layers. Normally, two neighboring channel layers are spaced-apart. There is no actual limitation to the total number of channel layers. For instance, the channel portion may comprise 2 to 100, or more specifically 5 to 50 channel layers. At least some of the channel layers, or even all of them, may be identical. In particular, one and the same (weak) topological insulator material may be used for every channel layer.

Normally, two neighboring channel layers are separated by an insulating layer, which comprises an insulating material different from the weak topological insulator material. This applies even if the p-regions and n-regions are not created by positive and negative electrodes as described above. For instance, if the p-regions and n-regions are created by different doping, it is also preferred that an insulating layer is disposed between two channel layers.

During the manufacturing process, one channel layer may be created by a deposition process whereafter the grooves are created by a suitable ablative process. Afterwards, a layer of insulating material is disposed on the upper surface where any deposition processes may be used that are suitable for creating the channel layers. Normally, the insulating material is also placed within the grooves, i.e. between the side surfaces. Due to its insulating property, it does not allow for any (or at least any substantial) current between the opposite side surfaces. Therefore the electron channels in different side surfaces remain insulated from each other.

While it is conceivable that each channel layer has its own heat conductor elements, it is preferred that the first electrodes of all channel layers are connected to a single first heat conductor element and/or the second electrodes of all channel layers are connected to a single second heat conductor element. This embodiment may have several advantages. For instance, the manufacturing process may be easier if only a single heat conductor element needs to be produced for all channel layers. Also, a single heat conductor element may provide a larger total contact surface for an element to be cooled than several separate heat conductor elements. Also, the individual channel layers are thermally connected "in parallel", which may also reduce any detrimental effect in the event of a failure of one channel layer.

Mostly when the thermoelectric device is used as a Peltier element for cooling, its effectiveness can be further enhanced if it comprises a plurality of consecutive channel portions with one heat conductor element disposed between two channel portions so that the second electrodes of one channel portion and the first electrodes of a neighboring channel portion are thermally connected to the same heat conductor element. This configuration may be described as several thermoelectric devices being connected in series, whereby a cooling effect can be considerably increased. Herein, the "cold side" of one channel portion corresponds to the "hot side" of the next channel portion. In other words, a heat conductor element disposed between two channel portions may be considered as the second heat conductor element of one channel portion while at the same time being the first heat conductor element of the next channel portion. In order to simplify the manufacturing process, all channel portions may be identical.

Especially when the thermal electric element is used as a Peltier element, the first and second electrodes of each channel layer may comprise a first terminal electrode and a second terminal electrode for connection to a voltage supply. When considering the above-mentioned series connection of the n-grooves, p-grooves and electrodes, the first and second terminal electrode are the first and last element in this series connection, respectively. In order to facilitate connection of these terminal electrodes, they may be connected to a conductor path at least partially formed on the respective channel layer.

If the thermoelectric device comprises a plurality of channel layers in each channel portion and/or a plurality of channel portions, the same voltage may be applied to the terminal electrodes of all channel layers. In particular, the first terminal electrodes of all channel layers may be electrically connected and/or the second terminal electrodes of all channel layers may be electrically connected. This means that all first terminal electrodes may be connected by at least one conductor. Likewise, all second terminal electrodes may be connected by at least one conductor. Thus, all channel layers can be connected in parallel.

The invention also relates to an integrated circuit which comprises an inventive thermoelectric device. Preferably, the thermoelectric device will be used as a cooling device. In such an integrated circuit, one heat conductor element can be thermally connected to an electronic element to be cooled, e.g. a microprocessor. Since the inventive thermoelectric device can be very effective even at a very small size of a few micrometers or even less than 1 micrometer, it can be useful for cooling any kind of microstructure.

BRIEF DESCRIPTION OF THE DRAWINGS

Further details and advantages of the present invention will be apparent from the following detailed description of not limiting embodiments with reference to the attached drawing, wherein.

DESCRIPTION OF THE ILLUSTRATED EMBODIMENTS

Figure 1:
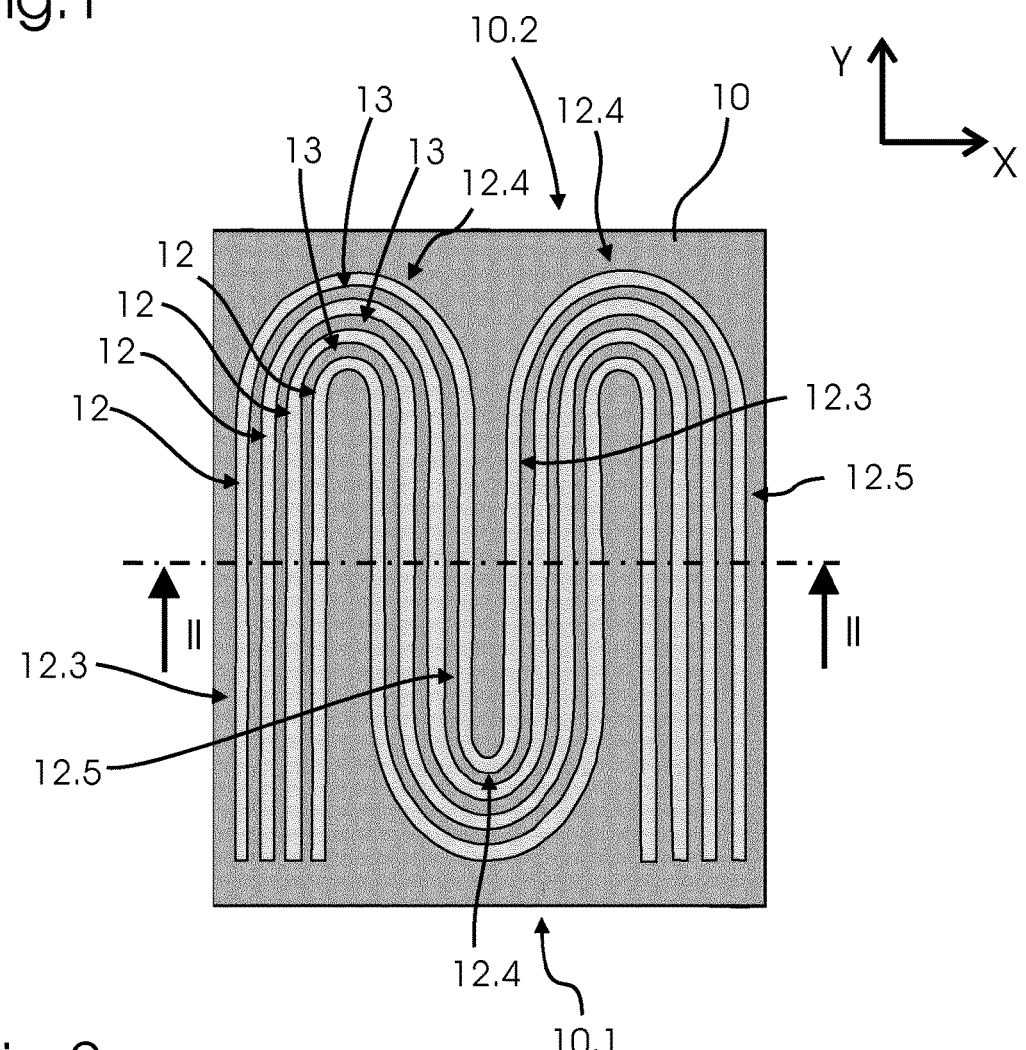
FIG. 1 is a schematic top view of a channel layer for a thermoelectric device.
Figure 2:
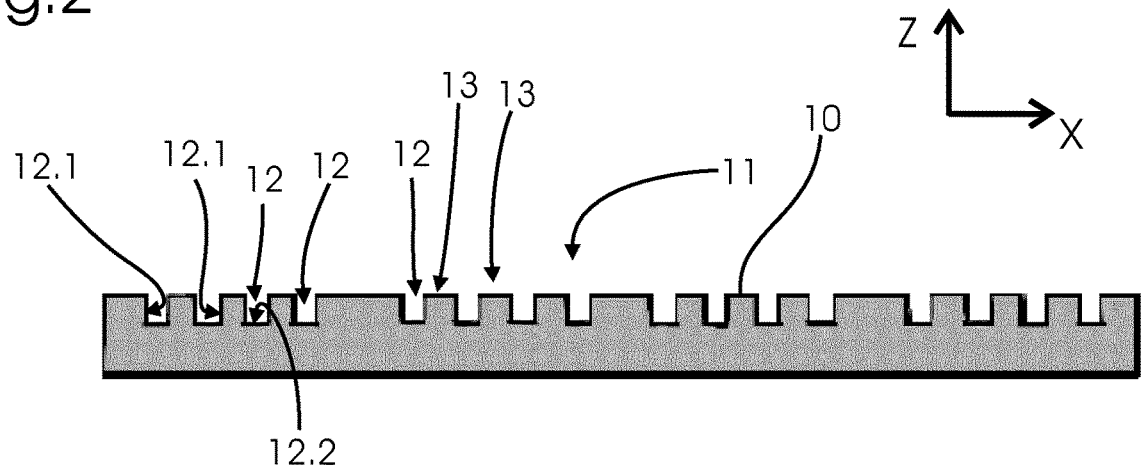
FIG. 2 is cross-sectional view according to the line II-II in FIG. 1.

FIGS. 1 and 2 show a schematic representation of a channel layer 10 for a thermoelectric device according to a general embodiment of the present invention. For ease of reference, a coordinate system with X-, Y- and Z-axis is shown in all figures. The channel layer 10 has a flat, roughly rectangular shape extending along the X-axis and Y-axis. An upper surface 11 of the first channel layer 10 extends along the X-Y-plane (which can also be referred to as the horizontal plane) and faces in the Z-direction. It should be noted that the dimensions of the embodiment in the figure are not to scale. The total length (along the Y-axis) and width (along the X-axis) of the first channel layer 10 may be e.g. several nanometers to several hundreds of nanometers and its thickness (along the Z-axis) may be e.g. 3 nm. Four meandering grooves 12 are disposed within the upper surface 11. Each of these grooves 12 has a rectangular cross-section with side surfaces 12.1 extending parallel to the Z-axis and a bottom surface 12.2 extending along the X-Y-plane. The width of each groove 12 may be e.g. 2 nm while its depth may be 1 nm but at least the distance between two atomic layers. Two neighboring grooves 12 are separated by a ridge 13 having a width that may be equal to the width of each groove 12. Within the meandering structure of each groove 12, several different portions 12.3, 12.4, 12.5 can be identified. Two n-grooves 12.3 run from a first end 10.1 of the channel layer 10 towards a second end 10.2 of the channel layer 10. They are mostly parallel to the Y-axis. Two p-grooves 12.5 run from the second end 10.2 towards the first end 10.1. Every n-groove 12.3 is connected to a p-groove 12.5 by a turning groove 12.4.

Figure 3:
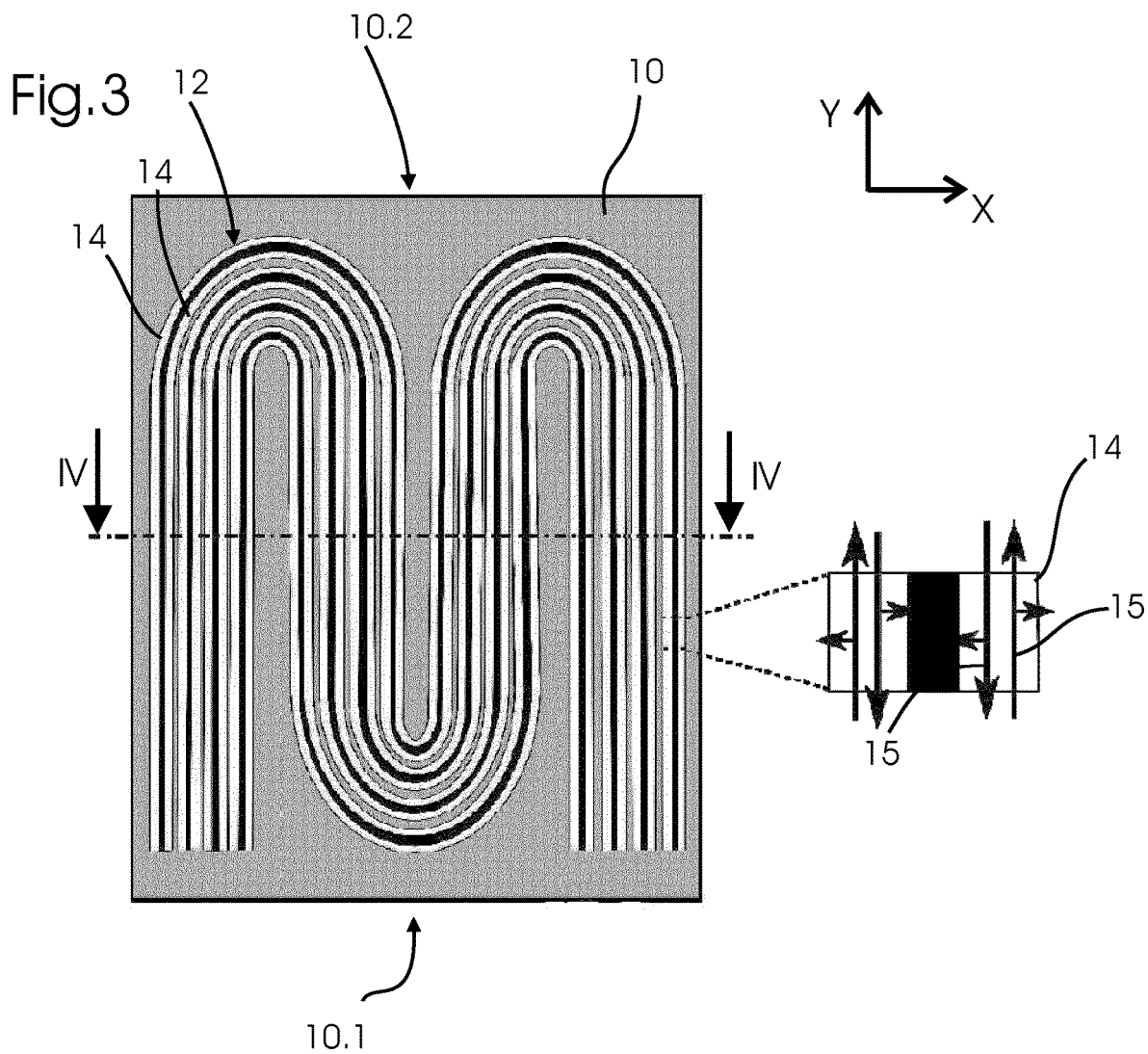
FIG. 3 is a schematic top view similar to FIG. 1 illustrating conducting zones.
Figure 4:
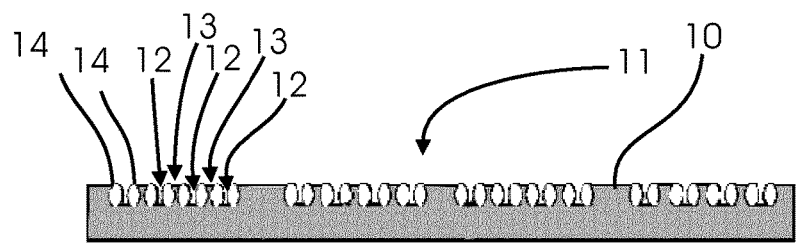
FIG. 4 is a cross-sectional view according to the line IV-IV in FIG. 3.

The first channel layer 10 is made of a weak topological insulator material, e.g. $Bi_{14}Rh_3I_9$. During the manufacturing process, it may be formed by a deposition process like electron beam epitaxy while the grooves 12 may be formed afterwards by nano-structuring methods like photolithography, electron-beam lithography or scanning probe microscopy scratching. The use of a weak topological insulator material combined with the structure of the first channel layer 10 leads to a special electrical conduction behavior which is illustrated in FIGS. 3 and 4. While the upper surface 11 as well as the bottom surfaces 12.2 of each groove 12 are electrically insulating, every side surface 12.1 of the grooves 12 comprises an electrically conducting zone 14 with a pair of topologically protected one-dimensional electron channels 15 which are schematically shown in FIG. 3. It is understood that the conducting zones 14 are only illustrated schematically and that their actual size and shape may be different depending on the specific weak topological insulator material. Note however, that a fingerprint of weak topological insulators is that the spatial density of states is very narrow, such that the grooves can be made very narrow as well. Each electron channel 15 allows for a propagation of electrons in the positive or negative Y-direction, respectively. Each electron channel 15 is spin-polarized, i.e. the direction of the spin of an electron correlates with its propagation direction. Due to the properties of the weak topological insulator, each electron channel 15 has a quantized conductance of $e^2/h$ (h being the Planck constant), which does not largely depend on the length, the depth or the width of the groove 12. Therefore, the length of the first channel layer 10 mentioned above could be largely increased without affecting the conductance at least up to the mean free path length which is of the order of several hundred of nanometers at room temperature. The total conductance of the first channel layer 10 is roughly proportional to the number of grooves 12. Due to the presence of the ridges 13 between the grooves 12 and due to the width of the grooves 12 themselves, there is normally no or only negligible electrical current between two neighboring conducting zones 14, i.e. these conducting zones 14 are electrically insulated.

Figure 5:
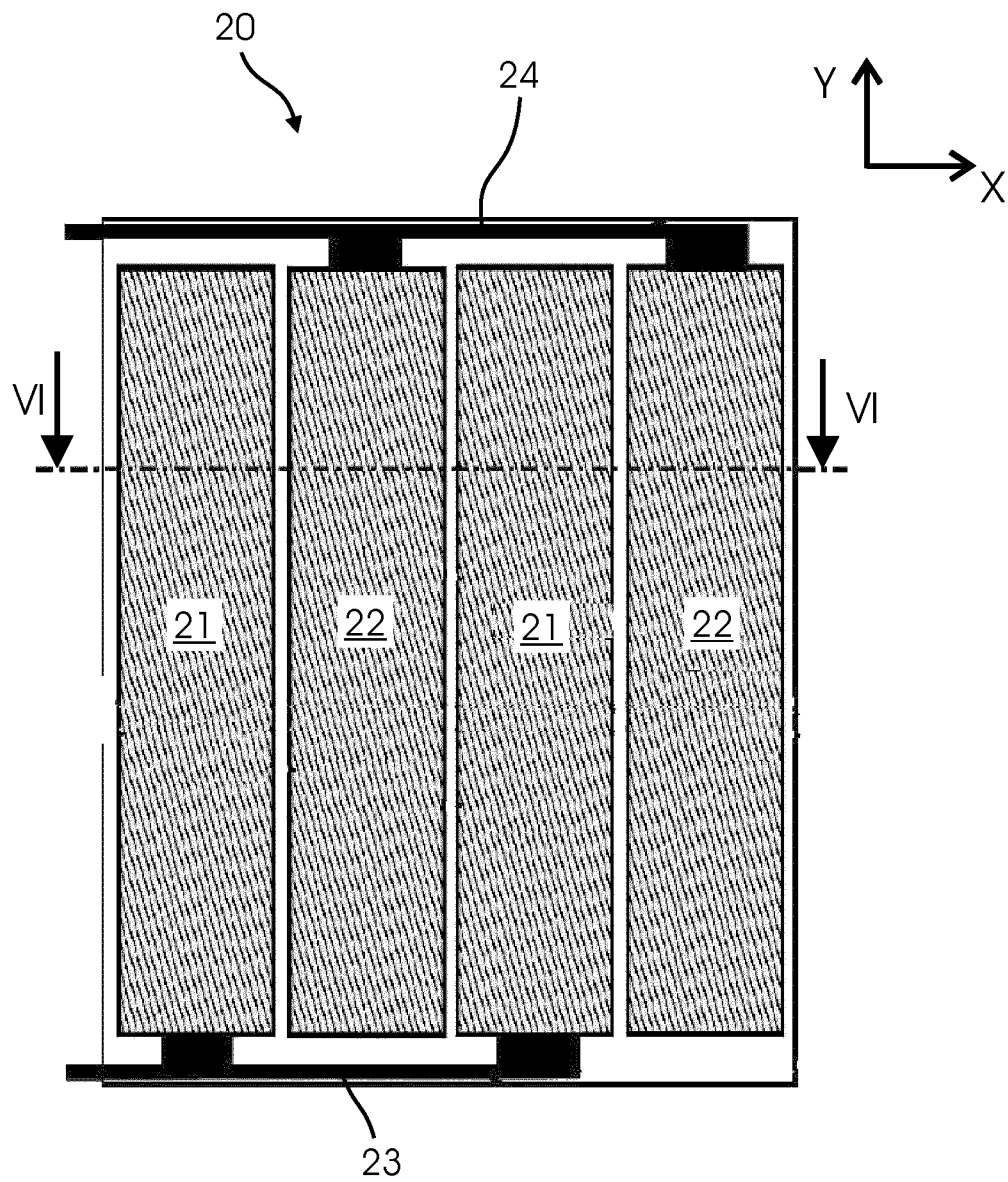
FIG. 5 is a cross-sectional top view of an insulating layer with positive and negative electrodes.
Figure 6:
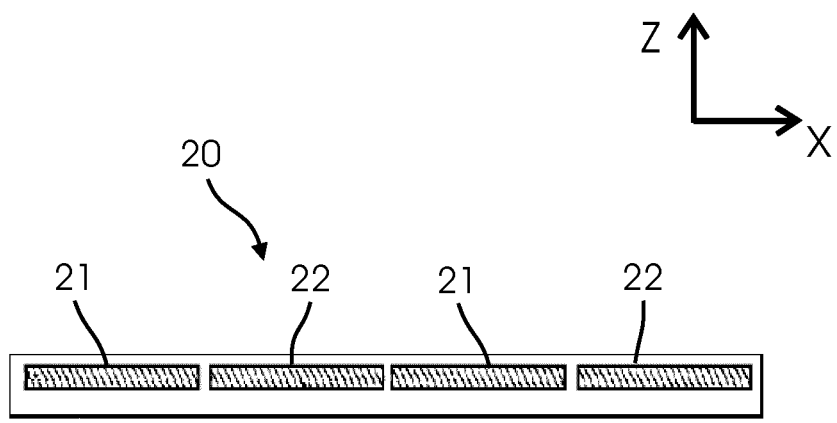
FIG. 6 is a cross-sectional view according to the line VI-VI in FIG. 5.

FIGS. 5 and 6 show an insulating layer 20 which may be used together with the channel layer 10 as part of a channel portion 50. The insulating layer 20 is mostly made of an electrically insulating material, in this case silicon dioxide. However, two negative electrodes 21 and two positive electrodes 22 are alternatingly disposed within the insulating layer 20. These electrodes 21, 22 are electrically insulated from each other by the insulating material except for the negative electrodes 21 being connected to a first conductor path 23 and the positive electrodes 22 being connected to a second conductor path 24. In this embodiment, the electrodes 21, 22 each have a flat, rectangular shape and cover most of the area of the insulating layer 20 within the X-Y-plane. Suitable metals for each of the electrodes 21, 22 are e.g. gold, copper, aluminum and silver.

Figure 7:
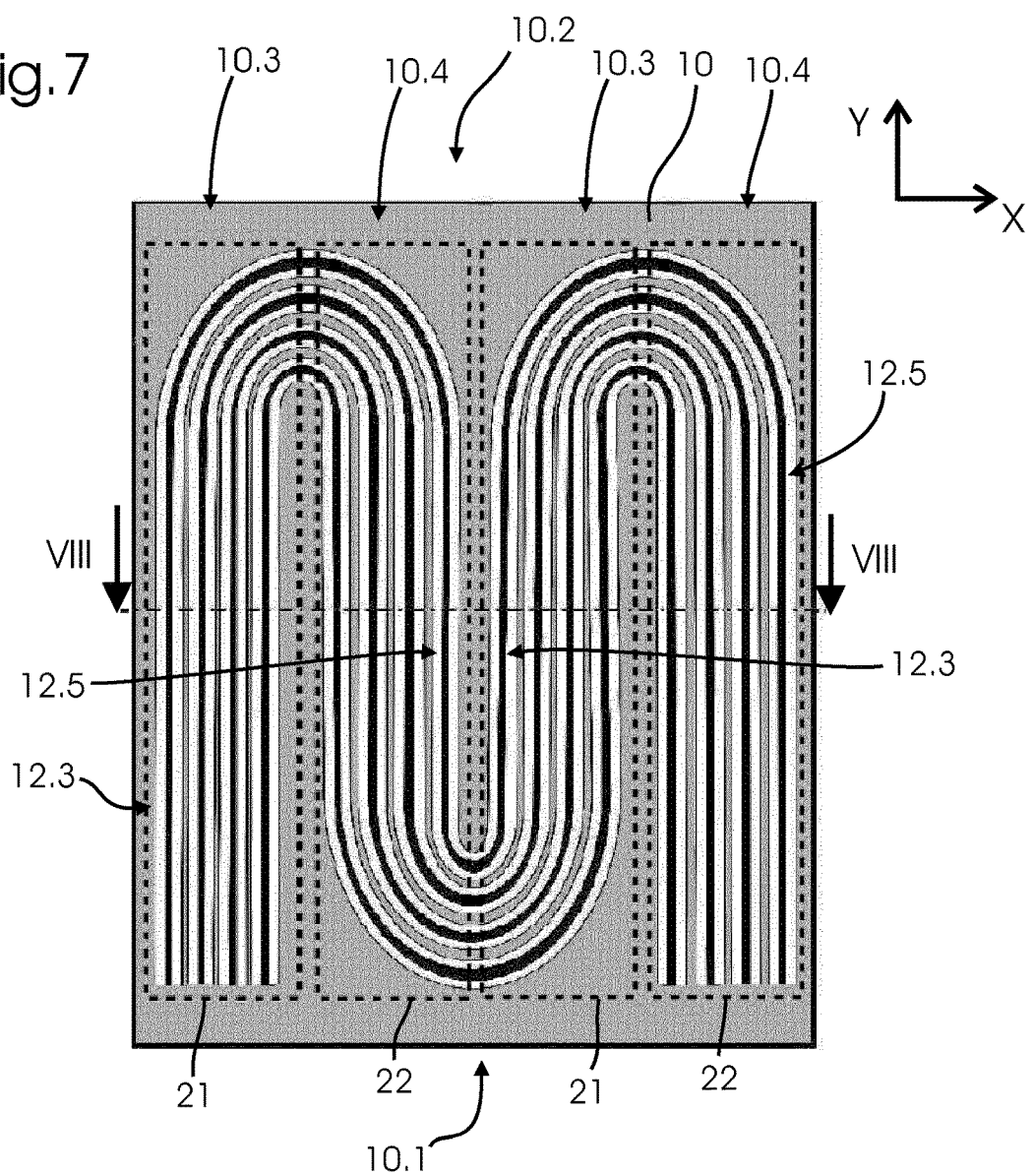
FIG. 7 is a top view of the channel layer on top of the insulating layer.
Figure 8:
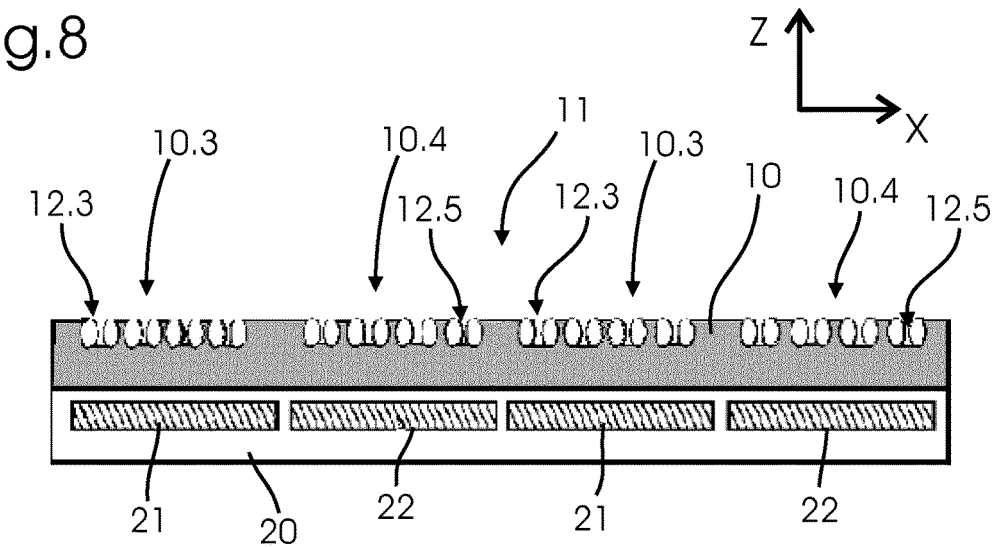
FIG. 8 is a cross-sectional view according to the line VIII-VIII in FIG. 7.

FIGS. 7 and 8 show the channel layer 10 as in FIGS. 1 to 4 placed on top of the insulating layer 20. Each negative electrode 21 is disposed under the n-grooves 12.3 and each positive electrode 22 is disposed under the p-grooves 12.5. During operation, a negative voltage is applied to the negative electrodes 21, which results in a shift of the Fermi level in an n-region 10.3 in the channel layer 10 above the respective negative electrode 21. Likewise, a positive voltage is applied to the positive electrodes 22, which results to a shift of the Fermi level in a p-region 10.4 in the channel layer 10 above the respective positive electrode 22. The respective shift is adjusted by an appropriate voltage so that the n-regions 10.3 are configured for electron conduction while the p-regions 10.5 are configured for hole conduction.

Figure 9:
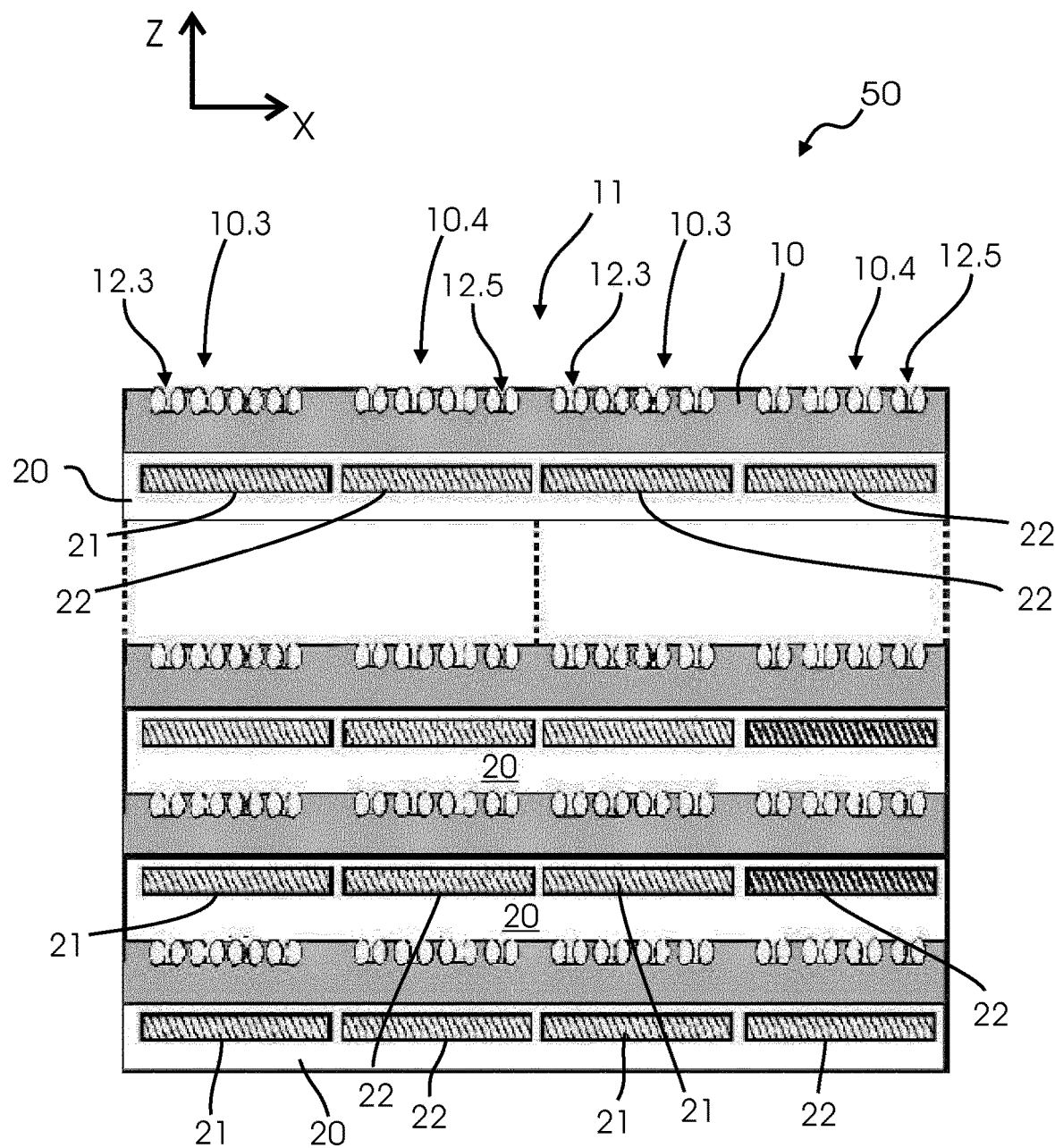
FIG. 9 is a cross-sectional view of a channel portion with a plurality of channel layers and insulating layers.

By repeatedly placing the structure shown in FIG. 7 above each other, a channel portion 50 as shown in FIG. 9 can be produced. In such a channel portion 50, a plurality of identical channel layers 10 are arranged in a stacked manner above each other (i.e. along the Z-axis). One of a plurality of insulating layers 20 is interposed between each two neighboring channel layers 10. The insulating material also fills the grooves 12, but due to its insulating properties, there is only negligible current flow between neighboring conducting zones 14. It is understood that by stacking a plurality of first channel layers 10, each of which comprises a plurality of grooves 12, the total conductance of the channel portion 50 is considerably increased and the resistance decreased as compared to the single channel layer 10 shown in FIG. 1.

Figure 10:
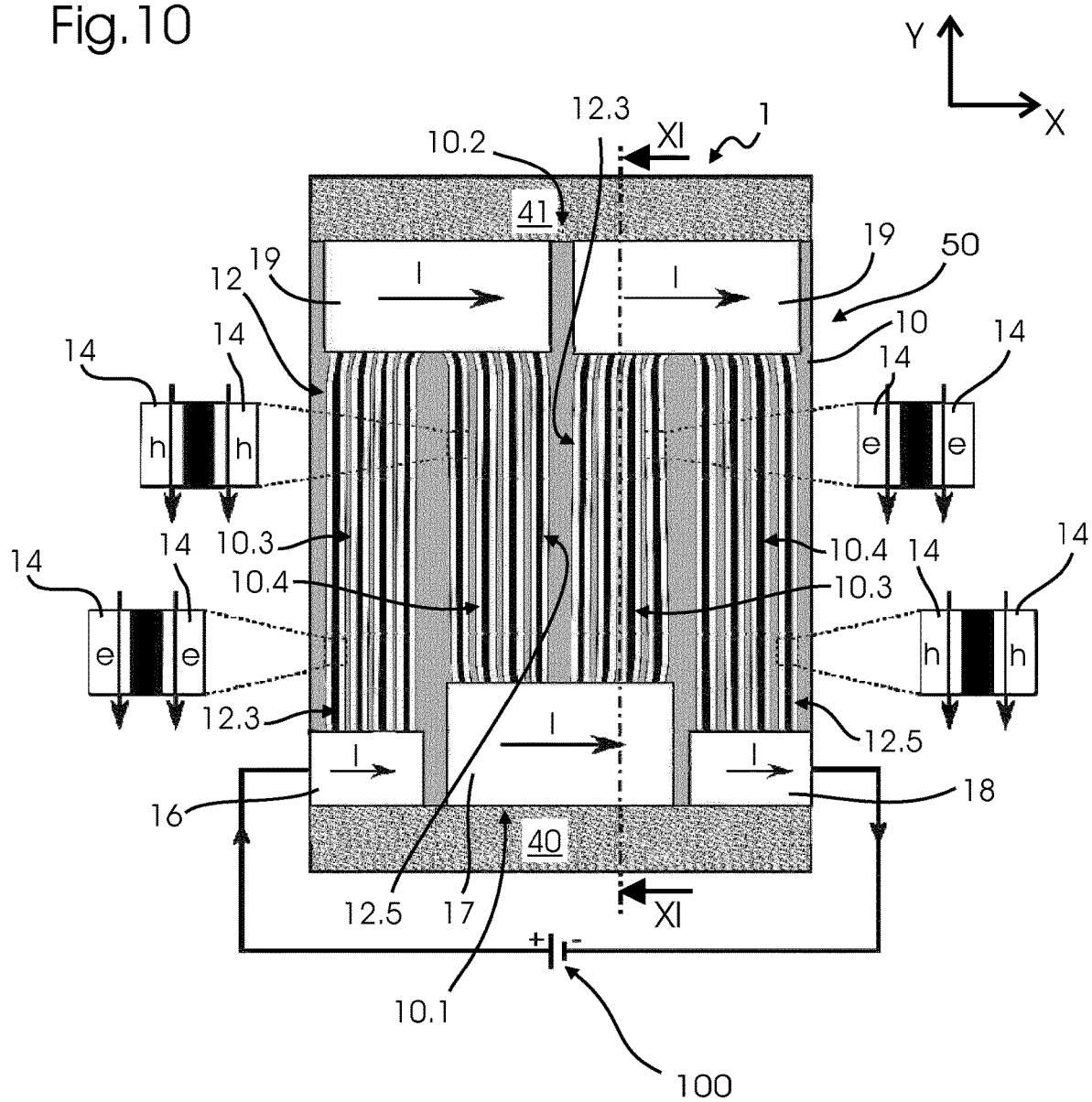
FIG. 10 is a top view of a thermoelectric element according to a first embodiment of the invention.
Figure 11:
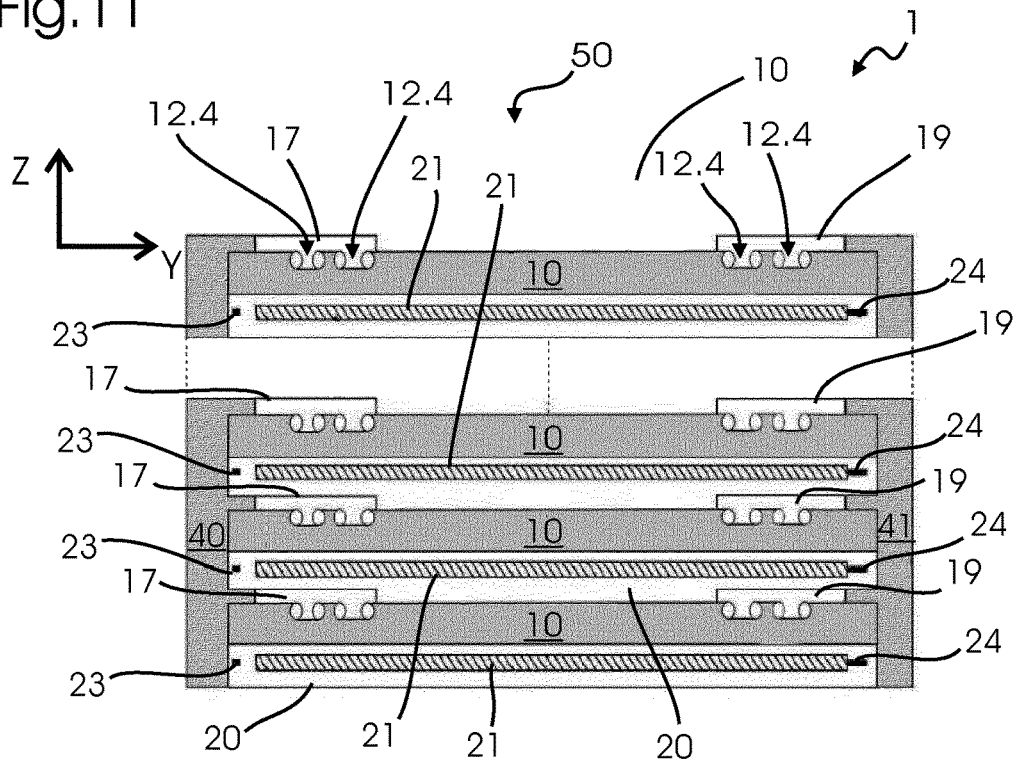
FIG. 11 is a cross-sectional view according to the line XI-XI in FIG. 10.

FIGS. 10 and 11 show a first embodiment of a thermoelectric device 1 according to the present invention. It comprises a channel portion 50 that is similar to the one shown in FIG. 9. However, on each channel layer 10, three first electrodes 16, 17, 18 are disposed at the first end 10.1, while two second electrodes 19 are disposed at the second end 10.2. The central first electrode 17 and the second electrodes 19 are each disposed on a turning groove 12.4 and extend from an n-region 10.3 to a p-region 10.4. The first electrodes 16-18 comprise a first terminal electrode 16 and a second terminal electrode 18, which are connected to a voltage supply 100. Although not shown explicitly, the first terminal electrodes 16 of all channel layers 10 are connected with each other (and with the voltage supply 100) and the second terminal electrodes 18 of all channel portions 10 are connected with each other as well. The same metals that are used for the positive and negative electrodes 21, 22 may be used for the first and second electrodes 16-19.

As the voltage supply 100 is switched on, an electrical current flows through the n-grooves 12.3 and the p-grooves 12.5 via the first and second electrodes 16-19. Due to the n-p junction between each n-region 10.3 and p-region 10.4, any current flow through the turning groove 12.4 is largely suppressed. The arrows in the electrodes 16-19 indicate the direction of the electrical current I, which is of course opposite to the direction of motion of electrons. Electrons need to pass from an n-groove 12.3 to an p-groove 12.5 at the first end 10.1, via the first electrode 17. This process necessitates each electron to release energy, which is disposed as heat in the first electrode. This leads to a warming of the first electrode 17 and, in turn, to a warming of a first heat conductor element 40 which is in thermal contact with the first electrode 17. Likewise, electrons need to pass from a p-groove 12.5 to an n-groove 12.3 at the second end 10.2 via the second electrode 19, which necessitates each electron absorbing energy, thereby withdrawing heat from the surrounding material. This leads to a cooling of the second electrodes 19, which, in turn, leads to a cooling of a second heat conductor element 41 which is in thermal contact with the second electrodes 19. As indicated by the magnified detail views in FIG. 10, the charge carriers e, h move in the same direction both in the n-groove 12.3 and in the p-groove 12.5, namely from the second end 10.2 towards the first end 10.1. The difference is that the charge carriers in the n-grooves 12.3 are electrons e, while the charge carriers in the p-grooves 12.5 are holes h.

The thermoelectric element 1 may be produced on a sub-micrometer scale and can be used in an integrated circuit where the second heat conductor element 41 could be in thermal contact with an electronic element to be cooled, i.e. a microprocessor.

Figure 12:
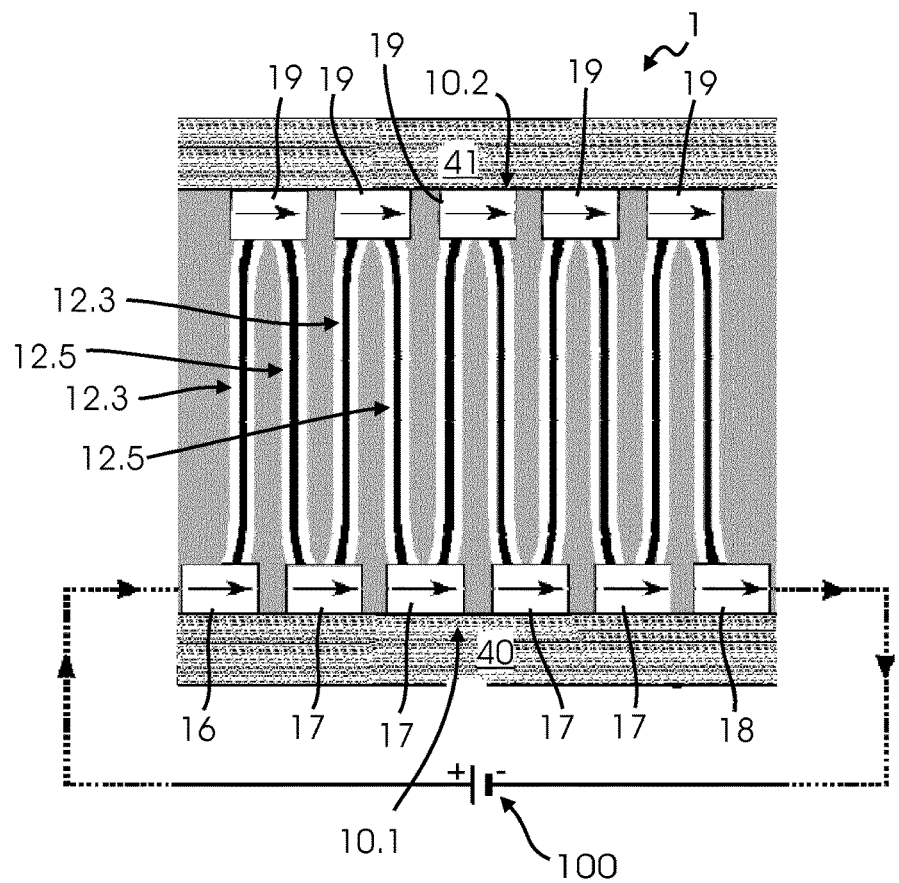
FIG. 12 is a top view of a thermoelectric element according to a second embodiment of the invention.

FIG. 12 is a top view of a second embodiment of a thermal electric element 1 according to the invention. The general design is similar to the thermoelectric element 1 shown in FIGS. 10 and 11. However, in this case, there is only one meandering groove 12 having a total of five n-grooves 12.3 and five p-grooves 12.5. Accordingly, there are six first electrodes 16, 17, 18 and five second electrodes 19. It is understood that the total number of n-grooves 12.3 and p-grooves 12.5, respectively, can be greater or smaller than five. Also, although FIG. 12 shows only a single meandering groove 12, this embodiment could be modified to include a plurality of meandering grooves 12.

Figure 13:
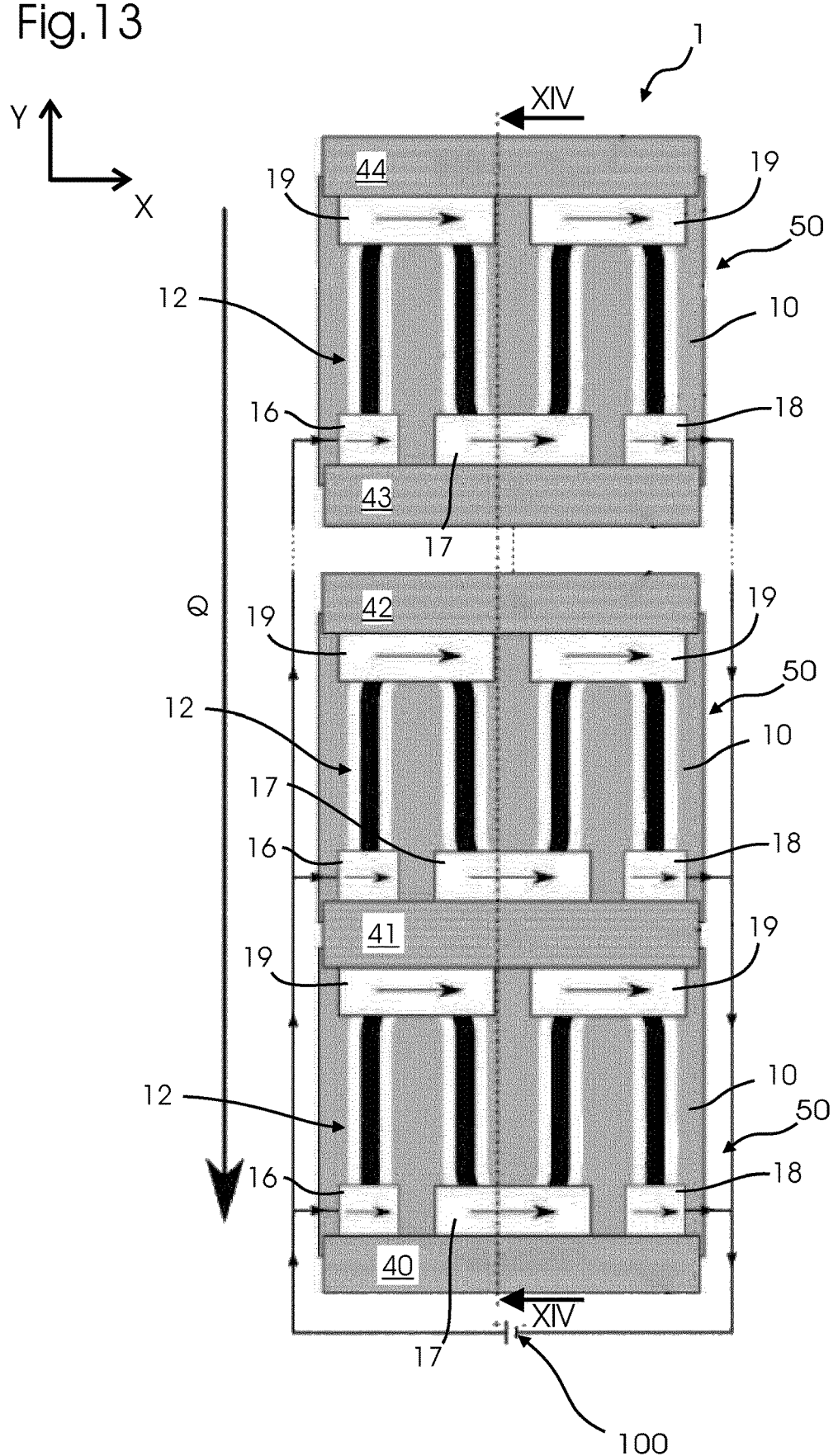
FIG. 13 is a top view of a thermoelectric element according to a third embodiment of the invention.
Figure 14:
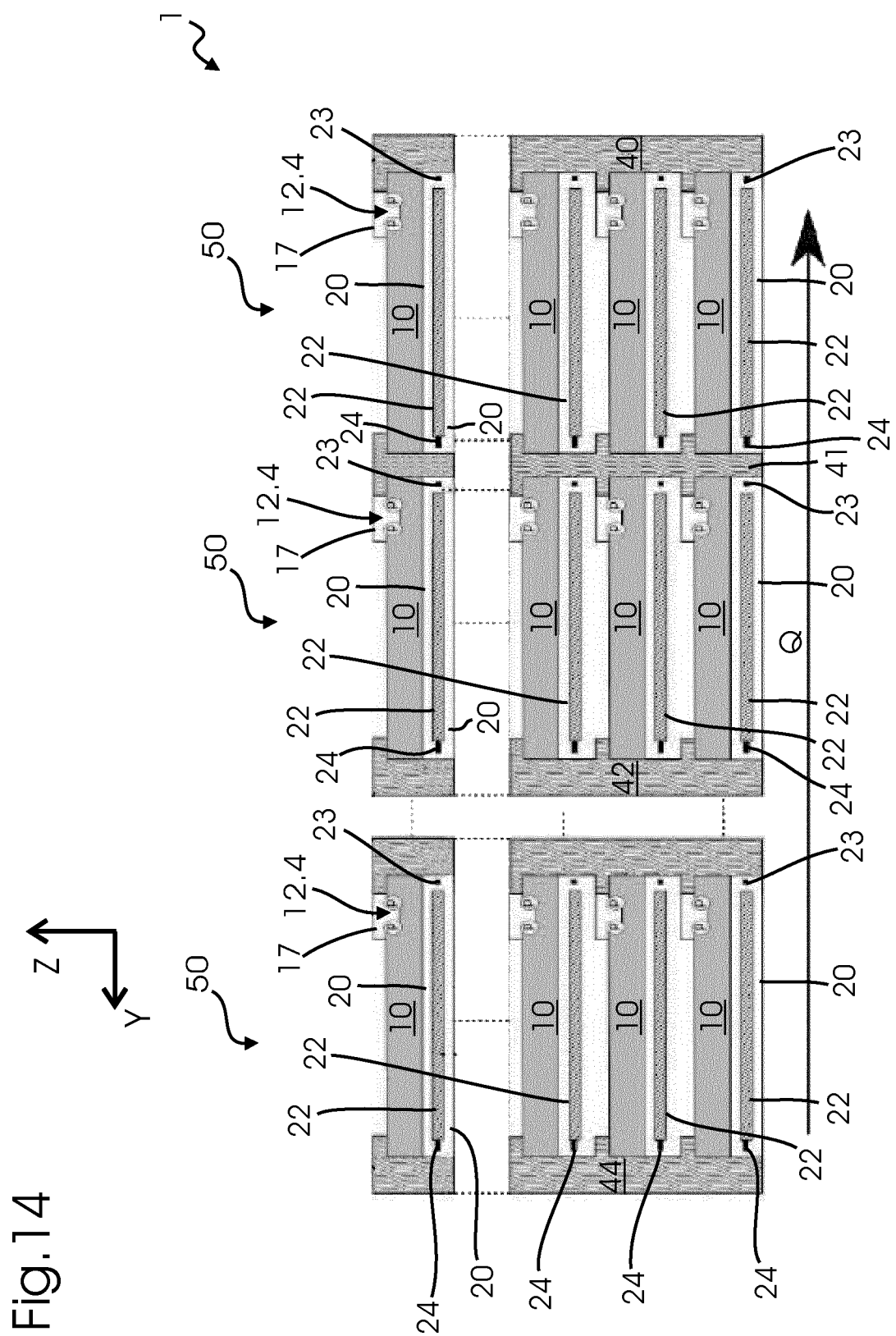
FIG. 14 is a cross-sectional view according to the line XIV-XIV in FIG. 13.

FIGS. 13 and 14 show a third embodiment of a thermoelectric element 1 according to the invention. In contrast to the first and second embodiment, it comprises a plurality of consecutive channel portions 50. The channel portions 50 are identical and similar to the design shown in FIG. 10, although they only comprise one meandering groove 12 per channel layer 10. The number of meandering groove 12 as well as the number of n-grooves 12.3 and p-grooves 12.5 could be modified, though. One heat conductor element 41, 42, 43 is disposed between two neighboring channel portions 50. The second electrodes 19 of one channel portion 50 and the first electrodes 16, 18, 17 of a neighboring channel portion 50 are thermally connected to the same heat conductor element 41, 42, 43. As temperature difference is regarded, each such heat conductor element 41, 42, 43 represents the "cold side" for one channel portion 50 while its represents the "hot side" for the other channel portion 50. All in all, there is a stepwise cooling process from the last heat conductor element 44 to the first heat conductor element 40, which enhances the overall flow of heat Q. In this embodiment, the first terminal electrodes 16 of all channel layers 10 and of all channel portions 50 are connected with each other (and with the voltage supply 100) and the second terminal electrodes 18 of all channel portions 10 and of all channel portions 50 are connected with each other as well.

The invention claimed is:

1. Thermoelectric device having a channel portion which comprises at least one channel layer made of a topological insulator material and having a top surface with at least one groove, wherein each side surface of each groove comprises a conducting zone with a pair of topologically protected one-dimensional electron channels, each channel layer comprising at least one n-region configured for electron-like conduction and at least one p-region configured for hole-like conduction, which n-regions and p-regions are alternatingly disposed and extend from a first end to a second end of the channel layer, each n-region comprising at least one n-groove running from a first electrode at the first end to a second electrode at the second end and each p-region comprising at least one p-groove running from a second electrode to a first electrode, wherein the first and second electrodes are alternatingly disposed to connect the p-grooves and n-grooves of neighboring regions, whereby all p-grooves and n-grooves are connected in series.

2. Thermoelectric device according to claim 1, wherein the topological insulator material is a weak topological insulator material and the top surface and a bottom surface of each groove are insulating.

3. Thermoelectric device according to any claim 1, wherein all first electrodes are thermally connected to a first heat conductor element and all second electrodes are thermally connected to a second heat conductor element.

4. Thermoelectric device according to, claim 1, wherein at least some regions comprise a plurality of spaced-apart grooves.

5. Thermoelectric device according to claim 1, further comprising at least one meandering groove comprising at least one p-groove connected to a n-groove by a turning groove, each turning groove extending from an n-region to a p-region.

6. Thermoelectric device according to claim 5, wherein at least one of the first and second electrodes is disposed on a turning groove.

7. Thermoelectric device according to claim 1, wherein each channel layer is disposed on an insulating layer which comprises an insulating material different from the topological insulator material, wherein a negative electrode is disposed in the insulating layer under each n-region and a positive electrode is disposed in the insulating layer under each p-region.

8. Thermoelectric device according to claim 7, wherein the insulating material has a relative permittivity of less than 10.

9. Thermoelectric device according to claim 7, wherein all positive electrodes are electrically connected and/or all negative electrodes are electrically connected.

10. Thermoelectric device according to claim 1, wherein the channel portion comprises a plurality of channel layers arranged in a stacked manner.

11. Thermoelectric device according to claim 10, wherein the first electrodes of all channel layers are connected to a single first heat conductor element and/or the second electrodes of all channel layers are connected to a single second heat conductor element.

12. Thermoelectric device according to claim 1, further comprising a plurality of consecutive channel portions with one heat conductor element disposed between two channel portions so that the second electrodes of one channel portion and the first electrodes of a neighboring channel portion are thermally connected to the same heat conductor element.

13. Thermoelectric device according to claim 1, wherein the first and second electrodes of each channel layer comprise a first terminal electrode and a second terminal electrode for connection to a voltage supply.

14. Thermoelectric device according to claim 13, wherein first terminal electrodes of all channel layers are connected and/or the second terminal electrodes of all channel layers are connected.

15. An integrated circuit comprising a thermoelectric device according to claim 1.

16. Thermoelectric device according to claim 7, wherein the insulating material has a relative permittivity of less than 5.

* * * * *